United States Patent [19]
Kubo et al.

[11] Patent Number: 5,793,674
[45] Date of Patent: Aug. 11, 1998

[54] SEMICONDUCTOR INTEGRATED CIRCUIT DEVICE, MANUFACTURING METHOD THEREOF, AND DRIVING METHOD FOR THE SAME

[75] Inventors: Kazuaki Kubo; Youichi Endo; Masanori Miyagi, all of Chiba, Japan

[73] Assignee: Seiko Instruments Inc., Japan

[21] Appl. No.: 409,041

[22] Filed: Mar. 22, 1995

[30] Foreign Application Priority Data

| Mar. 25, 1994 | [JP] | Japan | 6-56236 |
| Nov. 28, 1994 | [JP] | Japan | 6-293526 |
| Dec. 12, 1994 | [JP] | Japan | 6-307888 |
| Jan. 31, 1995 | [JP] | Japan | 7-14736 |

[51] Int. Cl.$^6$ ............................................. G11C 7/00
[52] U.S. Cl. ............................ 365/185.09; 365/189.07; 365/189.09; 365/189.11; 365/200
[58] Field of Search ............................. 365/200, 189.09, 365/189.07, 189.11, 185.09

[56] References Cited

U.S. PATENT DOCUMENTS

| 5,200,923 | 4/1993 | Sekiguchi | 365/185.09 X |
| 5,353,253 | 10/1994 | Hakajima | 365/225.7 X |
| 5,388,076 | 2/1995 | Ihara | 365/201 X |
| 5,406,516 | 4/1995 | Ihara et al. | 365/200 X |
| 5,446,693 | 8/1995 | Okamoto | 365/200 |
| 5,515,324 | 5/1996 | Tanaka | 365/185.09 |

*Primary Examiner*—Do Hyun Hoo
*Attorney, Agent, or Firm*—Adams & Wilks

[57] ABSTRACT

An EEPROM capable of arbitrarily setting a write time includes a timer circuit connected to a trimming circuit for determining a write time, and a trimming redundant memory array used for storing trimming data to be supplied to the trimming circuit in accordance with a predetermined write time so that the write time can be arbitrarily set. A series of calibration operations are performed such that the trimming data is read from the trimming redundant memory and supplied to the trimming circuit and the timer circuit is controlled so as to set the write time to a desired value. The latter operation is carried out in parallel to a normal write operation. Accordingly, neither special instructions nor an additional time period are required to perform the calibration operation, and a stable operation can be achieved in less time.

49 Claims, 9 Drawing Sheets

SEMICONDUCTOR INTEGRATED CIRCUIT DEVICE, MANUFACTURING METHOD THEREOF, AND DRIVING METHOD FOR THE SAME

BACKGROUND OF THE INVENTION

The present invention relates to a semiconductor integrated circuit device including a trimming circuit and a nonvolatile memory element, in which trimming data is stored into the nonvolatile memory element, and in which a calibration operation is carried out in such a manner that the stored trimming data is read from the nonvolatile memory element, and operation conditions of the semiconductor integrated circuit device are varied based upon the out read data.

Figure 9:
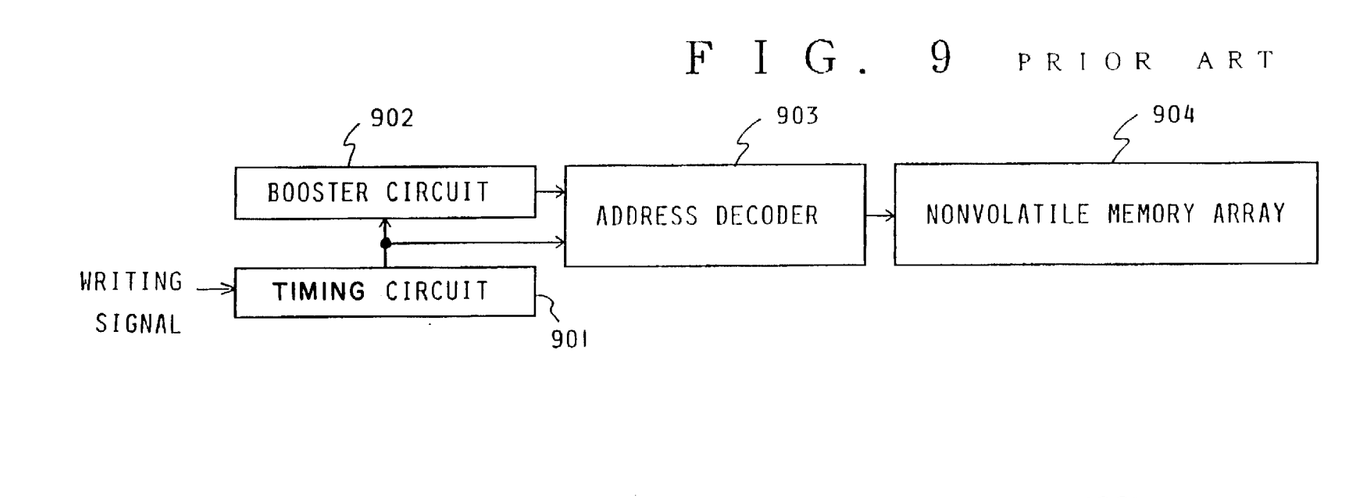
FIG. 9 is a circuit block diagram for representing the data writing operation of the conventional EEPROM.

Conventionally, in an electrically erasable/programmable nonvolatile memory device (will be referred to an "EEPROM" hereinafter), such a circuit arrangement that as shown in FIG. 9 is employed for writing data into a memory element.

A description will now be made of the circuit with reference to the drawings.

First, a write signal is inputted into a timer circuit 901.

In the timer circuit 901, a write operation timing is generated.

In response to the timing generated in the timer circuit 901, both a boosting circuit 902 and an address decoder 903 are operated to write data into a nonvolatile memory array 904.

Figure 10:
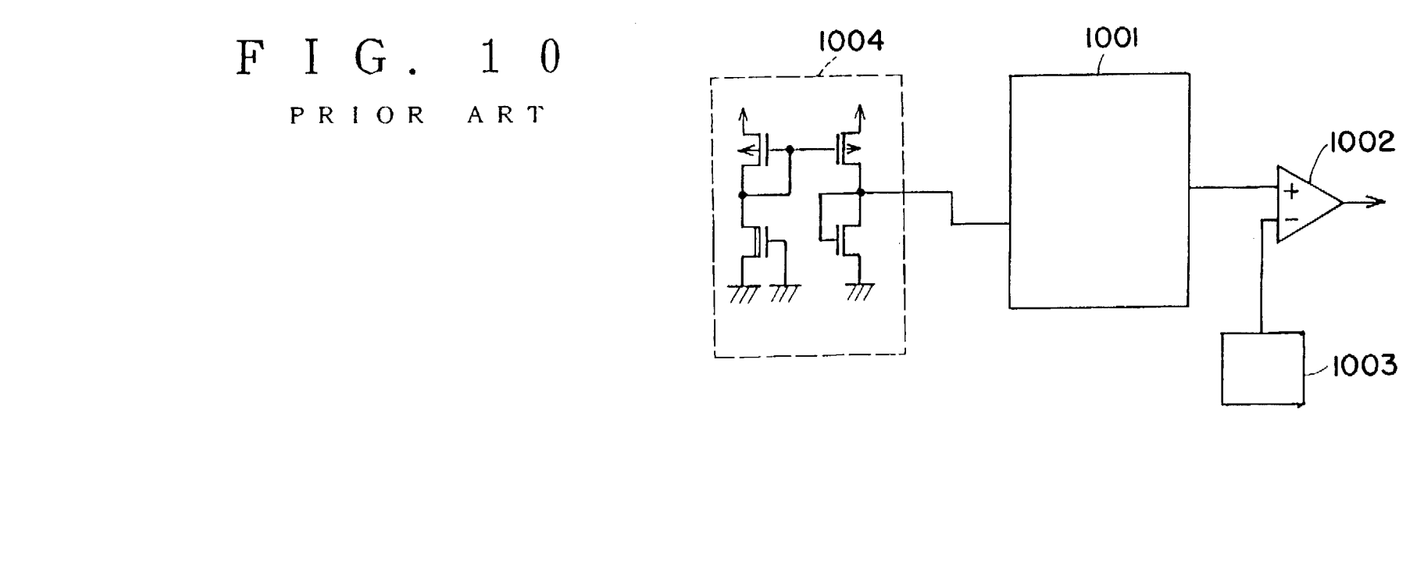
FIG. 10 is a block diagram for showing the timer circuit of the conventional EEPROM.

In FIG. 10, there is shown a block diagram of the conventional timer circuit.

As the operation of the timer circuit, a constant current circuit 1001 contains a capacitor through which a constant current may flow, so that the capacitor is charged.

A potential of the capacitor is compared with an output of a constant voltage circuit 1003 by a comparator 1002 corresponding to a voltage comparing circuit, so that a certain constant time can be maintained.

In the conventional timer circuit, the write time is controlled between 2 ms and 8 ms due to fluctuation in the circuit constant.

However, there is a demand to shorten the write time, i.e., it is required to assure the write time shorter than 1 ms.

When the write time is set to 1 ms to by the conventional circuit arrangement, since the write time must be between 0.5 ms to 2 ms due to fluctuation in the process parameter, the ambient temperature, and the power supply voltage, it could not ensure the write time shorter than 1 ms.

Then, a primary object of the present invention is to obtain an EEPROM capable of setting an arbitrary writing time in accordance with a desired specification so as to assure write time shorter than 1 ms.

Also, to set an arbitrary write time in accordance with a generally required specification, there is such a method for calibrating the respective devices by employing trimming information in accordance with the respective devices.

Figure 11:
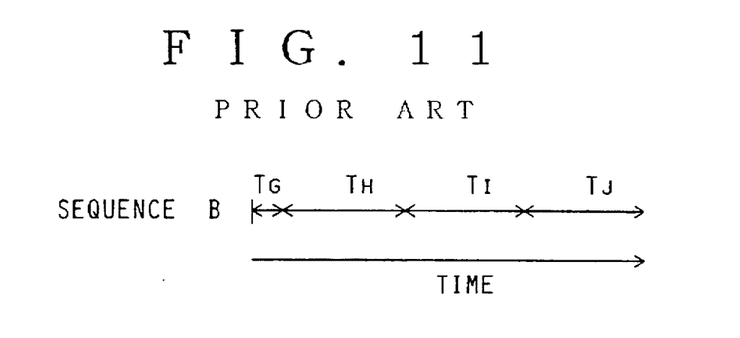
FIG. 11 is a sequence for explaining the conventional calibration.

FIG. 11 illustrates a sequence of an input signal entered into the input terminal of the conventional integrated circuit device having the calibration operation.

A sequence B describes an operation sequence for reading the content of the trimming data.

In this sequence B, there is provided a time period "$T_G$" during which the power supply voltage is applied to the integrated circuit device having the trimming circuit and the condition of this integrated circuit device is brought into the stable condition (in this case, this time period implies such a time period after the power supply is turned ON, when the integrated circuit is brought into the reset condition by the power-ON reset circuit, and will be referred to a "waiting condition" hereinafter). In addition, there is provided a time period "$T_H$" subsequent to the period "$T_G$", during which an instruction for instructing the integrated circuit to perform the trimming operation is acquired, and a time period "$T_I$" subsequent to the time period "TH", during which the content of the trimming circuit (will be referred to "trimming data" hereinafter) is read from the circuit in which the trimming data has been stored, and also a time period "$T_J$" subsequent to the time period "$T_I$", during which the read trimming data is set to the trimming circuit.

The above-described time periods $T_G$, $T_H$, $T_I$, and $T_J$ correspond to a sequence for the integrated circuit device which sets the content of trimming to the trimming circuit.

This is, generally speaking, called as "calibration".

When this calibration is completed, the integrated circuit device is brought into the operable condition.

It should be noted that although being omitted in FIG. 11, the normal operation is performed from the subsequent time period $T_K$.

As a result, the sequence of the time period $T_G$, the time period $T_H$, the time period $T_I$, and the time period $T_J$ is continuously executed, so that the integrated circuit device is brought into the operable condition.

Accordingly, in case that the integrated circuit device having the trimming circuit is such a device to be controlled as an EEPROM and the like, a controlling device such as a CPU for driving this integrated circuit device would require a predetermined amount of calibration time used to bring the EEPROM into the operable condition, and also the trimming read instruction must be newly added as the control command.

Figure 12:
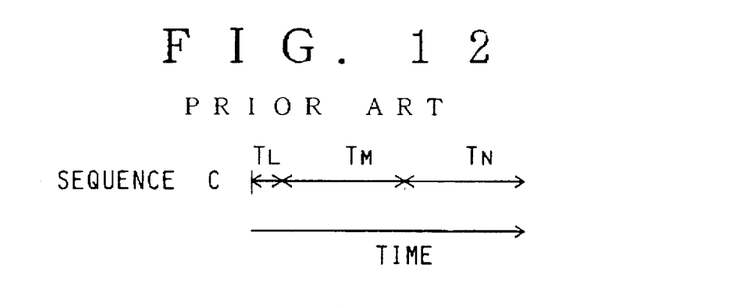
FIG. 12 is a sequence for explaining the conventional calibration.

In another sequence C shown in FIG. 12, there are provided a time period "$T_L$" during which the power supply voltage is turned ON and the operation condition is under waiting condition, a time period "$T_M$" subsequent to the time period "$T_L$" corresponding to the timing read time during which the trimming data is read from the circuit into which the trimming data has been stored, and a time period "$T_N$" subsequent to the time period "$T_M$", during which the trimming data is set to the trimming circuit.

Since the activation signal is outputted from the power supply voltage detecting circuit employed in the EEPROM and the like when the power supply voltage is turned ON, the time period $T_H$ of the trimming read instruction in the sequence B shown in FIG. 11 can be omitted.

The load of the microprogram of the CPU may be reduced because no trimming read instruction is needed, as compared with the sequence B.

However, when the power supply voltage detecting circuit is not sufficiently operated, there is a problem in achieving a stable operation when the trimming data is read from the circuit into which the trimming data has been stored.

Thus, a secondary object of the present invention is to realize a semiconductor integrated circuit device capable of readily and surely performing the calibration operation.

SUMMARY OF THE INVENTION

To solve the above-described problems, the present invention employs the below-mentioned means.

As a first means, means for storing therein trimming data, means for reading the trimming data, and means (which will be referred to as a "trimming circuit" hereinafter) capable of varying an operation condition of a semiconductor integrated circuit device based on the trimming data are mounted on the semiconductor integrated circuit device. The trimming circuit is forcibly set to an arbitrary initial condition, and at the same time, or thereafter, the trimming data is written into the means for storing therein the trimming data. Thus, the semiconductor integrated circuit is so arranged that the trimming data is subsequently read from the means for storing therein the trimming data by way of the means for reading the trimming data, and the semiconductor integrated circuit can be operated under a desirable operation condition by the trimming circuit driven by the trimming data. Also, such a method for manufacturing a semiconductor integrated circuit device is employed in which arbitrary trimming data is forcibly set into the trimming circuit of the semiconductor integrated circuit device at the beginning as an initial condition.

As a second means, such a semiconductor integrated circuit device is constructed as follows: In the semiconductor integrated circuit device according to the first means, when a specific signal is inputted into a specific terminal of the semiconductor integrated circuit device, which may fill the role of, for example, a test terminal, the trimming circuit is forcibly set to an arbitrary initial condition, and at the same time, or thereafter, the trimming data is written into the means for storing therein the trimming data. Subsequently, the trimming data is read from the storage means for storing therein the trimming data by the means for reading the trimming data, and furthermore the semiconductor integrated circuit device is operated under desired operation condition by the trimming circuit driven by the read trimming data. Also a method for manufacturing a semiconductor integrated circuit device is employed such that when arbitrary trimming data is forcibly set into the trimming circuit of the semiconductor integrated circuit device as an initial condition, a specific signal is inputted into a specific terminal.

As a third means, a semiconductor integrated circuit device is so arranged as follows: In the semiconductor integrated circuit device according to the first and second means, only when a specific signal is entered into a specific input terminal filling the role of, for instance, a test terminal, the trimming data which has been written into the means for storing therein the trimming data is outputted outside the semiconductor integrated circuit device.

As a fourth means, a semiconductor integrated circuit device for performing the operations as described in the second and third means is arranged when the specific signal as described in the second and third means has a voltage higher than the operating power supply voltage of the semiconductor integrated circuit device. Also, a method for manufacturing a semiconductor integrated circuit device is employed in which as a specific signal, such a higher (e.g., more than 12 V) voltage than the operating power supply voltage of the semiconductor integrated circuit device is applied to the semiconductor integrated circuit device.

As a fifth means, a semiconductor integrated circuit device is constructed as follows: In a semiconductor integrated circuit device comprising means for storing therein trimming data; means for reading the trimming data; and a trimming circuit, a series of such a calibration operation is arbitrarily executed in parallel to the normal operation of the semiconductor integrated circuit device without requirement of a specific operation command and a specific operation time period. This calibration operation is defined by the trimming data which has been written into the means for storing therein the trimming data is read by the trimming data reading means, and further the operation condition of the semiconductor integrated circuit is brought into a desired condition by the trimming circuit driven by the read trimming data.

As a sixth means, a semiconductor integrated circuit device is so arranged that the means for storing therein the trimming data according to the first means through the fifth means is employed as a portion of a constructive element of a nonvolatile memory element to thereby store the trimming data. Also, a method for manufacturing a semiconductor integrated circuit device is employed in which the trimming data is written into the nonvolatile memory element.

As a seventh means, a semiconductor integrated circuit device is so arranged that the nonvolatile memory element according to the sixth embodiment is electrically erasable/programmable.

As an eighth means, a semiconductor integrated circuit device is constructed as follows: In the semiconductor integrated circuit device according to the sixth means and the seventh means, this integrated circuit device includes a real memory array into which data is read/written in the normal operation, and a redundant memory array having a similar arrangement to that of the real memory array and positioned adjacent to said real memory array is used as the means for storing therein the trimming data. Also, a method for manufacturing a semiconductor integrated circuit device is employed in which the trimming data is written into the redundant memory array.

As a ninth means, such a semiconductor integrated circuit device is arranged as follows: In the semiconductor integrated circuit device according to the eighth means, the trimming circuit is connected to both of the real memory array constructed of a nonvolatile memory element and a timer circuit for determining a time required to write data into the redundant memory array, the time required to write the data into the redundant memory array can forcibly set as an initial condition, and at the same time, or thereafter arbitrary trimming data is written into the redundant memory array with employment of the forcibly set writing time. Next, during the writing operation to the real memory array, such a calibration operation is arbitrarily performed in a parallel manner that the trimming data stored in the redundant memory array is read out, and the timer time is trimmed based on the read data. Also, a method for manufacturing a semiconductor integrated circuit device is employed in which as the trimming data, the data indicative of the data writing time to the nonvolatile memory element, which is determined by the timer circuit, is written into the redundant memory array.

As a tenth means, a method for manufacturing a semiconductor integrated circuit device is employed as follows: In the semiconductor integrated circuit device according to the ninth means, a time is forcibly set as an initial condition to the trimming circuit, at which data can be firmly written into the nonvolatile memory element, and thereafter such a trimming data indicative of a desired data writing time is written into a redundant memory array.

As an eleventh means, a method for manufacturing a semiconductor integrated circuit device is employed as follows: In the semiconductor integrated circuit device according to the tenth means, such a trimming data to be written within the longest time which may be trimmed is forcibly set to the trimming circuit as an initial condition.

As a twelfth means, such a semiconductor integrated circuit device comprising a real memory array constructed of a nonvolatile memory element according to the ninth means, a redundant memory array having a similar arrangement to that of said real memory array and positioned adjacent to said real memory array, a trimming circuit driven by the trimming data stored in the redundant memory, a row decoder, and a column decoder, wherein as the normal operation sequence, the following sequence operation is required in such a manner that a period $T_A$ corresponding to a waiting condition, a period $T_B$ subsequent to the period $T_A$, for acquiring an instruction code, a period $T_C$ subsequent to the period $T_B$, for acquiring an address to specify the nonvolatile memory element within said real memory array, and a period $T_D$ subsequent to the period $T_C$, for acquiring data to be written into the nonvolatile memory element, or for reading data of the nonvolatile memory element are time-sequentially activated. More specifically, this semiconductor integrated circuit device in which the nonvolatile memory element is employed as a portion of the constructive element is driven in accordance with the sequence defined by the above mentioned time periods, i.e., the period $T_A$ the period $T_B$, the period $T_C$, the period $T_D$, the period $T_E$, and the period $T_F$. Both of the row decoder and the column decoder selects the redundant memory array just after the semiconductor integrated circuit device has received the data write instruction in the period $T_B$; the operation for reading the trimming data stored in the redundant memory array is carried out in the period $T_E$ existing in parallel to the period $T_C$; just after these periods $T_C$ and $T_E$, both of the row decoder and the column decoder select the relevant nonvolatile memory element within the real memory array selected in the period $T_C$; subsequently, the previously read trimming data is transferred to the trimming circuit in the period $T_F$ existing in parallel to the period $T_D$ and subsequent to the period $T_E$; and then the data acquired in the period $T_D$ is written into the nonvolatile memory element within the real memory array in the data writing time determined by the trimming data sent to the trimming circuit immediately after the period $T_D$ and the period $T_F$.

As a thirteenth means, a semiconductor integrated circuit device is constructed in such a manner that in the semiconductor integrated circuit device according to the twelfth means, the integrated circuit device employs an output control circuit. This output control circuit controls the device such that the trimming data read from the redundant memory array is not externally outputted during the normal write operation.

As a fourteenth means, such a circuit is constructed that to which the electrically erasable/programmable nonvolatile memory device of the serial interface according to the first means to the thirteenth means is connected as a control device such as a CPU and the like.

Since the first means is employed, the semiconductor integrated circuit device can trim an arbitrary operation as an arbitrary condition and also can forcibly set the operation condition into an arbitrary initial condition.

Since any one, or plural means from the second means to the fourth means are employed, it is avoidable that the trimming data is unnecessarily rewritten.

Since the fifth means is employed, the semiconductor integrated circuit device can perform the calibration operation without any special time period and any special operation instruction.

As the sixth means is introduced, the trimming data can be arbitrarily written and also can be maintained without applying the power supply voltage.

Since the seventh means is employed, it is possible to electrically rewrite the trimming data many times without employing a specific data erasing device.

As the eighth means is introduced, it is possible to store the trimming data by increasing a very small area and a very small circuit scale.

Since the data write time to the EEPROM can be set as arbitrary write time by employing the ninth, twelfth and thirteenth means, the data write time shorter than 1 ms is assured. Furthermore, since neither the special time for calibration, nor the special operation instruction is required, the semiconductor integrated circuit device may have compatibility with the conventional semiconductor integrated circuit device and also the calibration can be firmly performed.

Although no explanation is specifically required in the present invention, since the trimming data is not outputted outside the semiconductor integrated circuit device during the normal operation, it is also possible to apply the inventive idea to such a case. That is, the calibration may be carried out for such a necessary circuit while the normal reading operation to read the data from the real memory array is performed.

Since the tenth means and the eleventh means are employed, it is possible to firmly set a data writable time even under such a state that any data are stored in the initial condition of the nonvolatile memory element, so that the trimming data can be stored.

Since the fourteenth means is employed, the controlling device such as the CPU can calibrate the controlled device such as the EEPROM without requiring the special time period or the special operation instruction, so that the load given to the microprogram can be reduced.

DETAILED DESCRIPTION OF THE PREFERRED EMBODIMENTS

An embodiment of the present invention will now be described with reference to the attached drawings.

Figure 1:
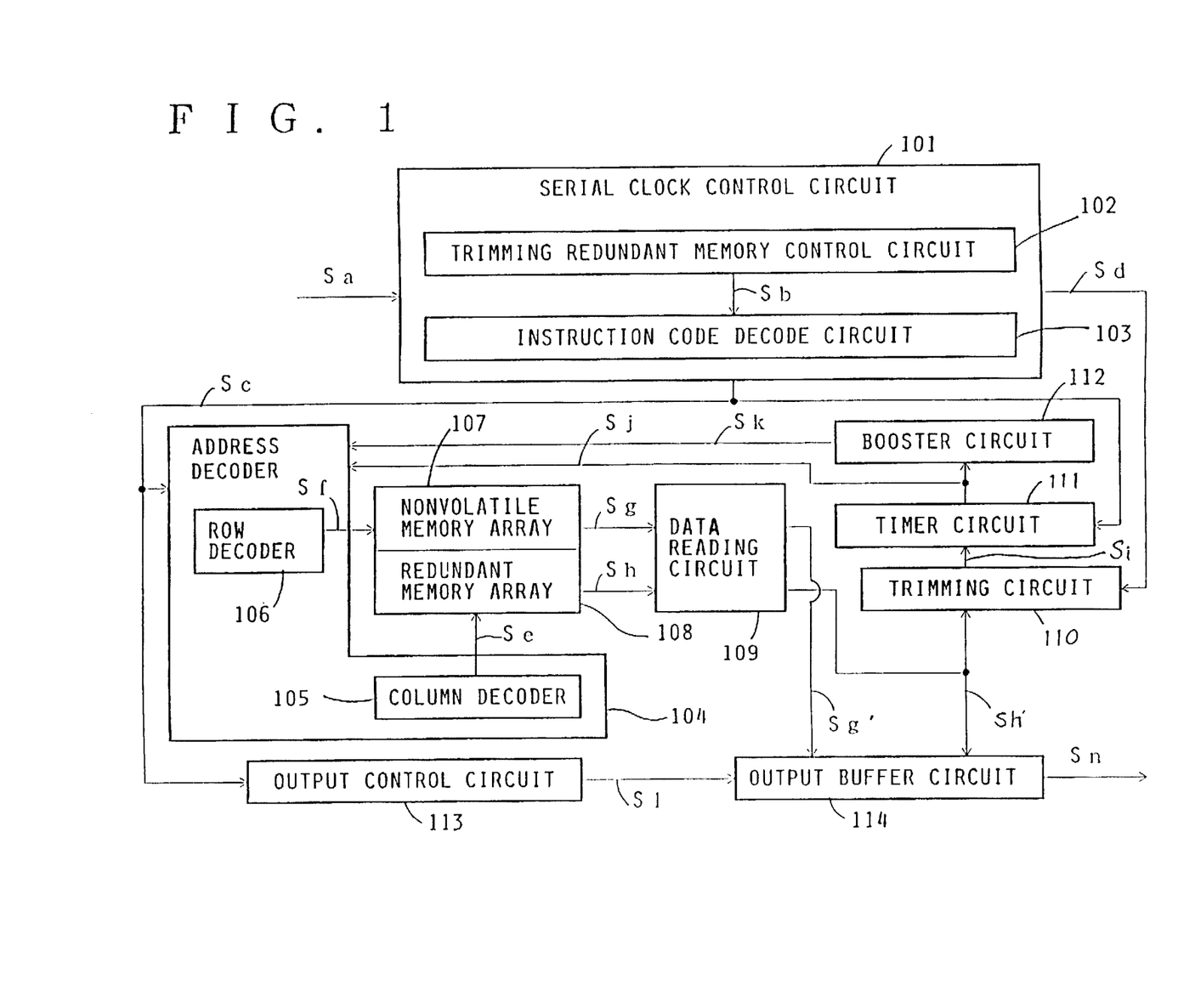
FIG. 1 is a schematic block diagram for indicating an embodiment of the present invention.

FIG. 1 is a schematic block diagram of a serial interface EEPROM for representing an embodiment of the present invention.

In FIG. 1, this EEPROM includes a nonvolatile memory array 107 functioning as a real memory array used to read/write data during the normal operation and a redundant memory array 108 for storing therein trimming data, and a trimming circuit 110 is connected to a timer circuit 111 for determining a data write time to the nonvolatile memory element.

The trimming circuit 110 controls a current flowing through the trimming circuit 110 based on the data stored in the trimming redundant memory array 108.

As a result, the trimming circuit 110 outputs a trimming signal $S_i$ for controlling the timer circuit 111.

The output of the timer circuit 111 is connected to a boosting circuit 112 used to produce a high voltage, and an address decoder 104. This high voltage is required to write data. The address decoder 104 contains a column decoder 105 and a row decoder 106.

The output of the boosting circuit 112 is connected also to the address decoder 104.

The output of the address decoder 104 is connected to the nonvolatile memory array 107 corresponding to the real memory array, and the trimming redundant memory array 108. In response to an output signal $S_e$ of the column decoder 105 and also an output signal $S_f$ of the row decoder 106, which are included in the address decoder 104, a selection is made of the relevant memory element of the nonvolatile memory array 107 and the trimming redundant memory array 108.

With the above described circuit arrangement, when the serial clock control circuit 101 first recognizes the writing operation instruction, the output signal $S_c$ of the serial clock control circuit 101 is entered as the write signal into the timer circuit 111. Then, in response to the timing produced from the timer circuit 111, both of the boosting circuit 112 and the address decoder 104 are operated so that the data is written into either the nonvolatile memory array 107, or the trimming redundant memory array 108.

However, under such an initial condition immediately after the circuit has been formed on a silicon substrate, since the data of the trimming redundancy memory array is unstable, the output signal of the timer circuit becomes unstable, and there are some cases in which the write time becomes insufficient to write the data into the nonvolatile memory element.

Then, the serial clock control circuit 101 is so arranged that when a special signal is added to the input signal $S_a$, the externally applied trimming data can be directly supplied to the trimming circuit 110 as a direct trimming signal $S_d$.

It should be noted in FIG. 1 that although only one input signal $S_a$ is illustrated, a plurality of input signals $S_a$ may be employed. In this embodiment, since the calibration is carried out in the serial interface EEPROM, at least a terminal into which the serial clock is inputted, another terminal into/from which the serial data is inputted/outputted, and a test terminal for designating the test mode are connected to the serial clock control circuit. When a voltage on the order of, for instance 12 V to 13 V higher than the operating power supply voltage of the EEPROM is applied to the test terminal at predetermined timing, the operation state is entered into the test mode in which the data acquired from the serial data input terminal is directly supplied to the trimming circuit in synchronism with the serial clock.

Figure 2:
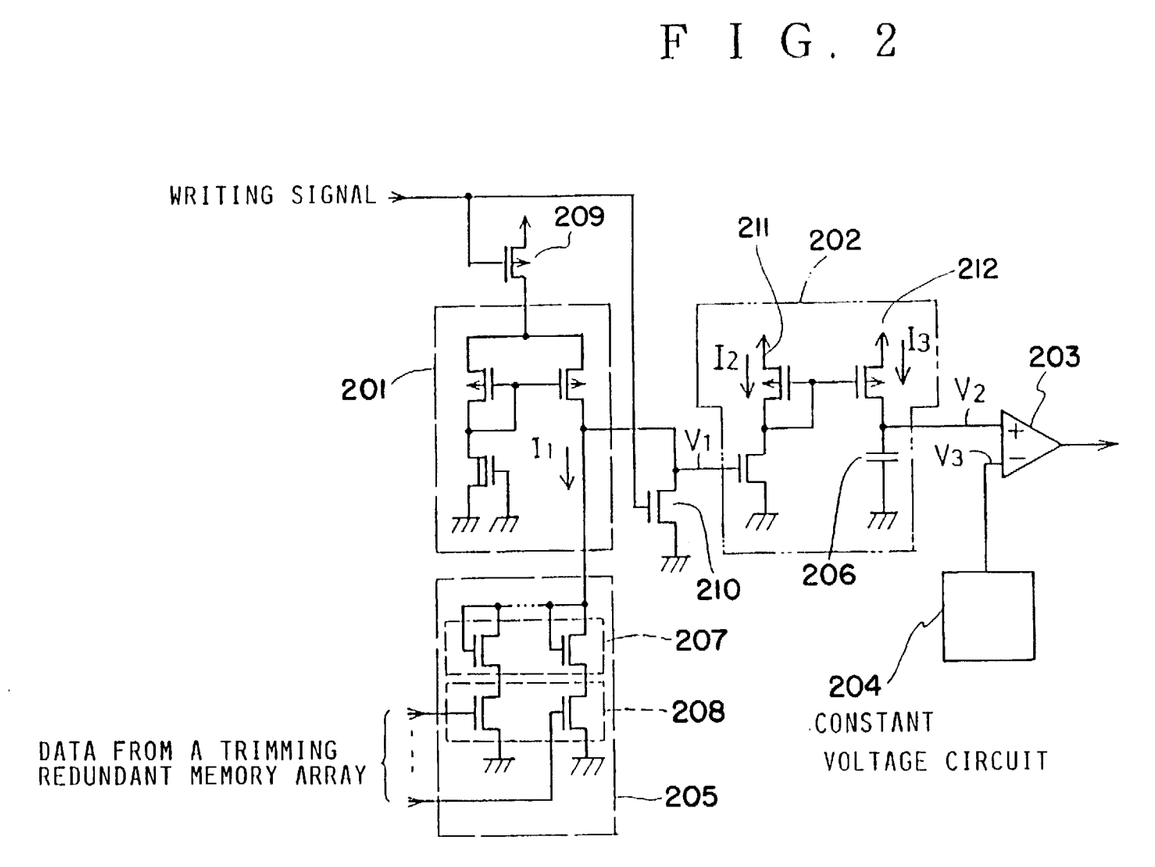
FIG. 2 is a circuit diagram of the timer circuit and the trimming circuit, according to a first embodiment of the present invention.

In FIG. 2, there is shown an internal circuit arrangement of the timer circuit and the trimming circuit according to a first embodiment of the present invention.

In the trimming circuit 205, a plurality of constant current transistors 207 connected under saturation conditions are connected in a parallel form.

To these constant current transistors 207, switching transistors 208 are series-connected, respectively.

The gates of the switching transistors 208 are controlled based upon the data stored in the trimming redundant memory array 108.

The output of the trimming circuit 205 is connected to a constant voltage circuit 201 and further to a constant current circuit 202.

When the write signal is inputted, the switching transistors 209 and 210 are turned ON and OFF, respectively, so that the constant voltage circuit 201 starts its operation.

The output voltage of the constant voltage circuit becomes such an output in accordance with the trimming signal of the trimming circuit 205.

In other words, the greater the number of switching transistors 208 in the trimming circuit 205 which are turned ON, the larger the current flowing through the trimming circuit 205. Thus, the output voltage of the constant voltage circuit 201 is approximated to the GND level.

Conversely, when the number of switching transistors 208 employed in the trimming circuit 205 which are turned ON is lowered, the current flowing through the trimming circuit 205 is reduced, so that the output voltage of the constant voltage circuit 201 is approximated to the Vcc level.

The closer the output voltage of the constant voltage circuit 201 is approximated to the GND level, the smaller the current flowing through the constant current circuit 202 becomes, so that a time period is prolonged for charging up a capacitor 206 to a predetermined voltage.

That is, the output timing of the timer circuit is delayed so that the write time is prolonged. The closer the output voltage of the constant voltage circuit 201 is approximated to the Vcc level, the larger the current flowing through the constant current circuit 202 becomes, so that a time period is shortened for charging up the capacitor 206 to a preselected voltage.

In this case, the output timing of the timer circuit becomes quick, so that the write time is shortened.

At this time, the constant current transistors 207 connected in the parallel manner need not have the same sizes with each other. Thus, these constant current transistors 207 may have a plurality of different sizes, and when these transistors with such different sizes are combined with each other, a fine trimming control is available.

The basic idea of this trimming operation will now be explained more in detail.

First, a current $I_1$ flowing through the trimming circuit 205 is expressed by the following equation (1):

$$I_1 = \mu C_{ox} K_1 (V_1 - V_{T1})^2 \tag{1}$$

where symbol "$\mu$" indicates carrier mobility, symbol "$C_{ox}$" represents a capacitance of a gate oxide film per unit area, symbol "$K_1$" denotes a summation of ratios of to length of the constant current transistors 207 connected to the switching transistor 208 which is turned ON in response to the output from the trimming memory array 108, symbol "$V_1$" shows an output voltage from the trimming circuit, and symbol "$V_{T1}$" is a threshold voltage of the switching transistor 208.

Next, currents $I_2$ and $I_3$ flowing through the constant current circuit 202 are expressed by the following equation (2):

$$I_2 = I_3 = \mu C_{ox} K_2 (V_1 - V_{T2})^2 \qquad (2),$$

where symbol "$K_2$" shows a ratio of width to length of the transistor 213, symbol "$V_{T2}$" indicates a threshold voltage of the transistor 213.

Assuming now that $V_{T1} = V_{T2}$, it is given as follows:

$$I_3 = (K_2/K_1) \cdot I_1 \qquad (3).$$

Again, assuming that an amount of charge stored in the capacitor 206 is Q and a time for requiring this charge-up operation is T, when the output voltage V2 of the constant current circuit 202 becomes equal to the output voltage V3 of the constant voltage circuit 204, it is given by the following equation (4):

$$T = Q/I_3 = (K_1 Q)/(K_2 I_1) \qquad (4),$$

where since symbol "$K_2$" is a constant, symbol "$I_1$" is a constant current, and symbol "Q" is a constant value, the time T is direct proportional to the constant $K_1$.

It is assumed that a certain value of $K_1$ is $K_{1REF}$, and a time thereof is $T_{REF}$, the below-mentioned equations are given as follows:

$$T_{REF} = (Q/(K_2 I_1)) \cdot K_{1REF} \qquad (5)$$

$$\therefore Q/(K_2 I_1) = T_{REF}/K_{1REF} \qquad (6).$$

Accordingly, it is given as follows:

$$T = (K_1/K_{1REF}) \cdot T_{REF} \qquad (7).$$

Then, the time T may be set by trimming the value of $K_1$ with respect to the value $K_{1REF}$.

In accordance with the present invention, the desirable write time can be set in the trimming manner by firstly trimming an arbitrary value $K_{1REF}$ and then measuring the time $T_{REF}$ at this time.

The trimming method of the present invention has such an advantage that since the time $T_{REF}$ is measured for each of the devices to perform the trimming operation, fluctuation caused by the process parameters among the devices can be completely suppressed.

Figure 3:
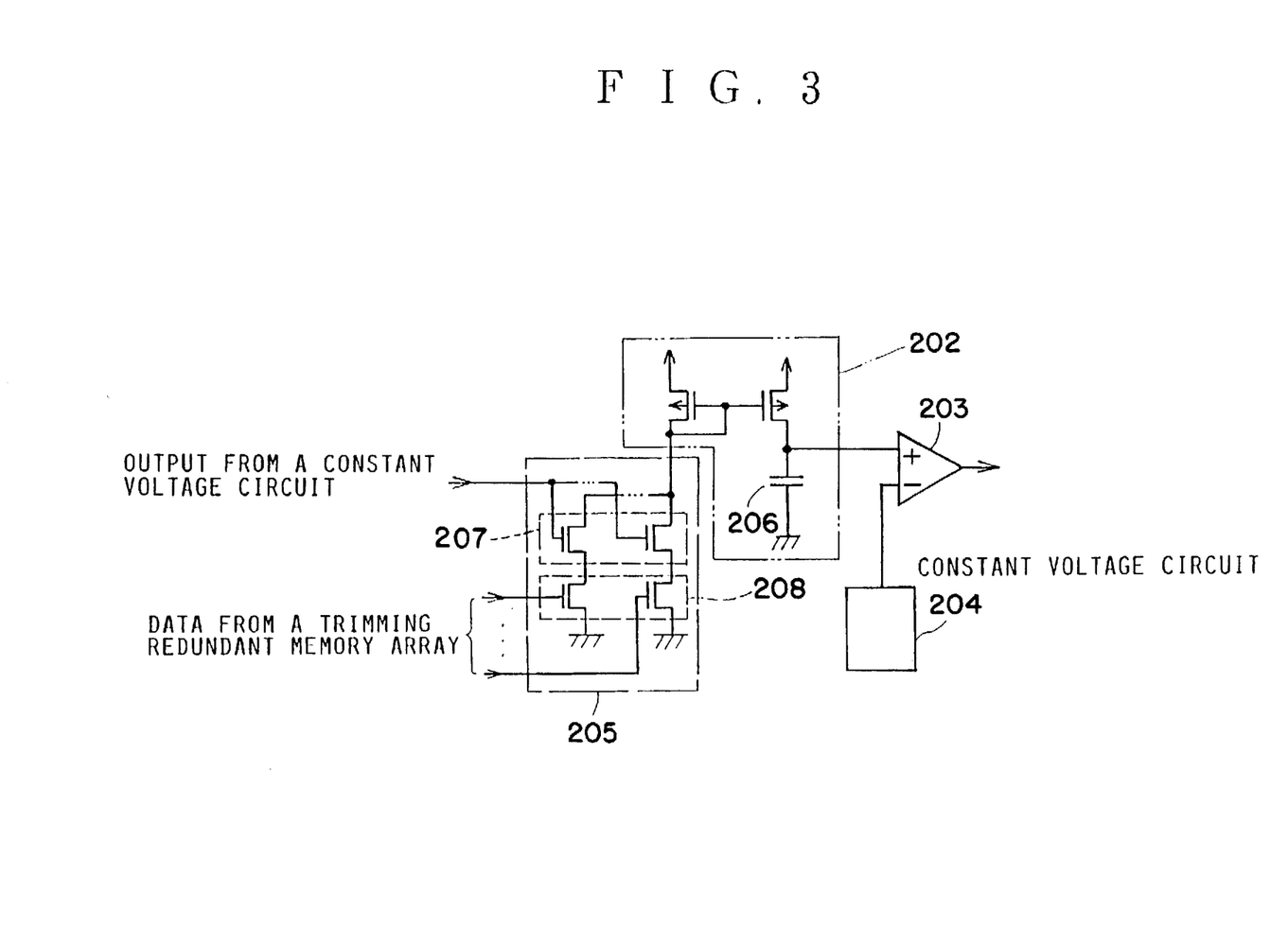
FIG. 3 is a circuit diagram of the timer circuit and the trimming circuit, according to a second embodiment of the present invention.

FIG. 3 schematically shows an internal circuit of the timer circuit and the trimming circuit, according to a second embodiment of the present invention.

In this second embodiment, a trimming circuit 205 is directly connected to such a constant current circuit 202 constructed of a current mirror circuit, and the constant voltage circuit 201 of the previous embodiment of FIG. 2 is omitted.

The trimming circuit 205 is so arranged that a plurality of constant current transistors which are connected in parallel to each other and are driven by the output voltage of the constant voltage circuit, are connected to the current mirror circuit, and furthermore a switching transistor 208 is series-connected to each of the plural constant current transistors 207. Similar to the first embodiment, the data write time may be set in response to the data of the trimming redundant memory array 108.

It should be noted that in this case, the constant voltage circuit 201 may be trimmed in a similar manner, or may not be trimmed.

Figure 4:
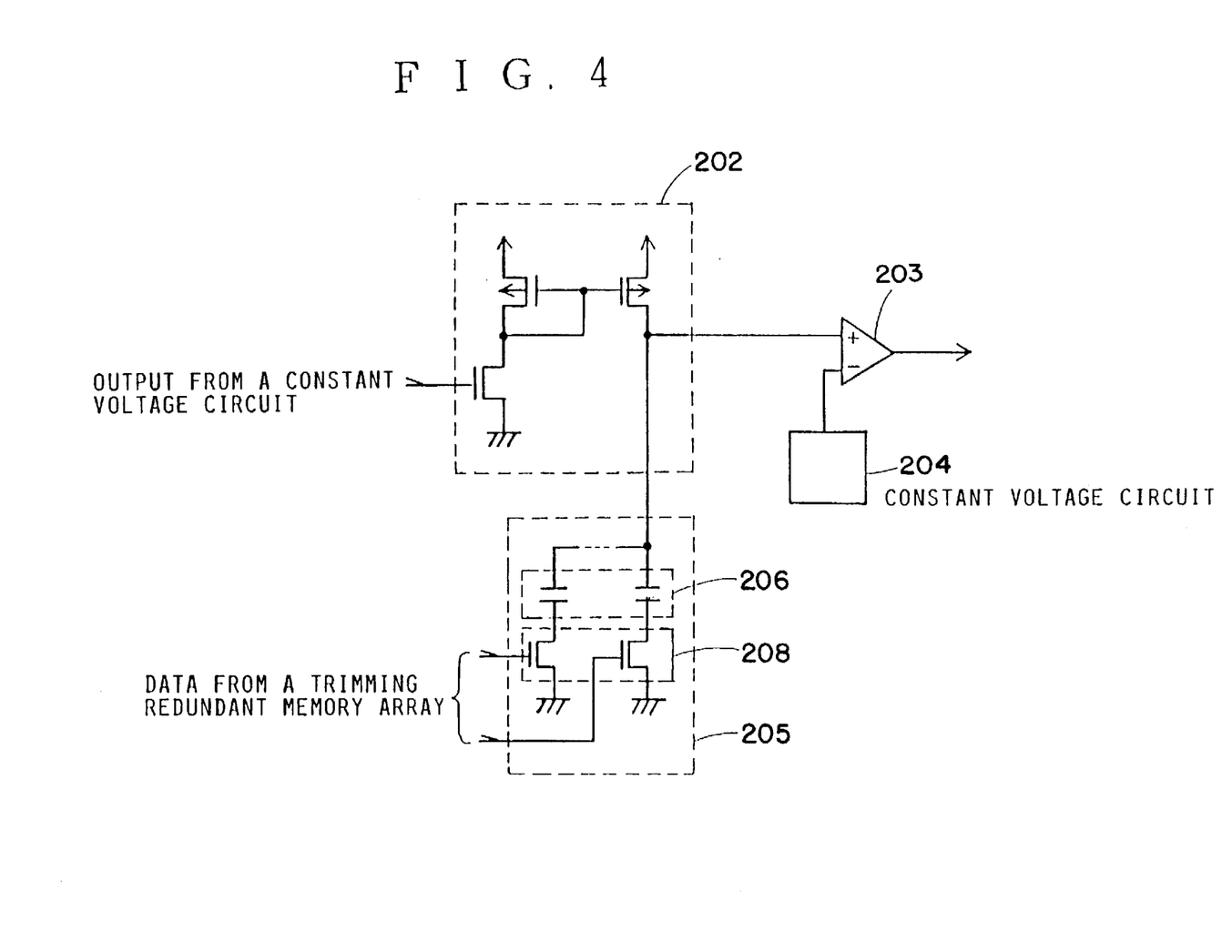
FIG. 4 is a circuit diagram of the timer circuit and the trimming circuit, according to a third embodiment of the present invention.

FIG. 4 schematically represents an internal circuit of the timer circuit and the trimming circuit, according to a third embodiment of the present invention.

In this third embodiment, a trimming circuit 205 is directly connected to a capacitor 206 coupled to the constant current circuit 202 arranged by the current mirror circuit, and the constant voltage circuit 201 of the previous embodiment shown in FIG. 2 is omitted.

As described above, even when the capacitor 206 is trimmed, a predetermined write time may be set.

Figure 5:
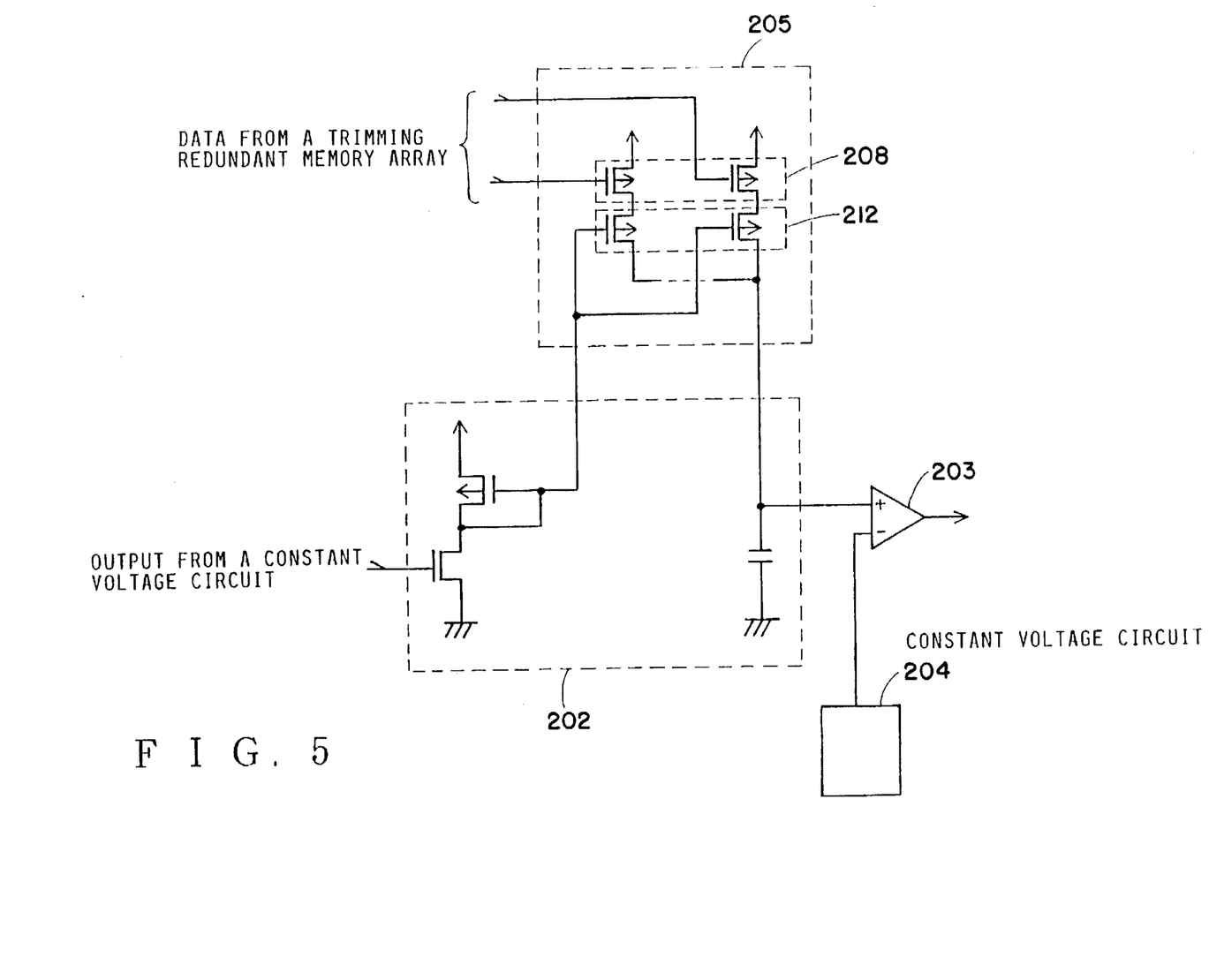
FIG. 5 is a circuit diagram of the timer circuit and the trimming circuit, according to a fourth embodiment of the present invention.

FIG. 5 schematically represents an internal circuit of the timer circuit and the trimming circuit, according to a fourth embodiment of the present invention.

In accordance with this fourth embodiment, the trimming circuit 205 is directly connected to the current mirror circuit corresponding to the constructive element of the constant current circuit 202, and the constant voltage circuit 201 shown in FIG. 2 of the first embodiment is omitted.

As described above, even when a PMOS transistor 212 of the current mirror circuit is trimmed, a preselected write time may be set.

Although not shown in this drawing, even if the constant voltage circuit 204 functioning as a reference voltage generating circuit connected to a comparator 203 for performing a voltage comparison is trimmed in a similar manner, a preselected write time may be set.

Figure 6:
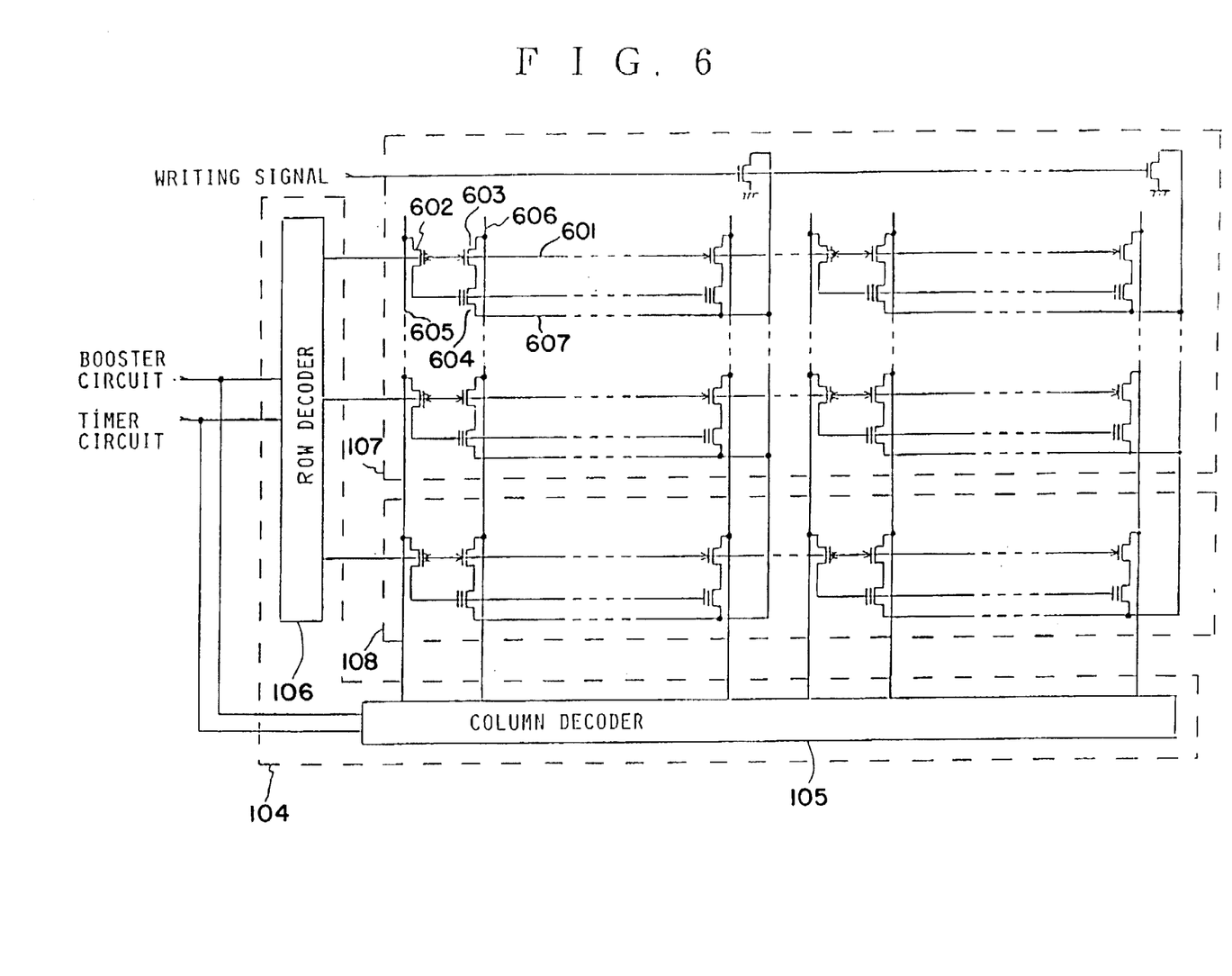
FIG. 6 is a circuit diagram for partially representing the nonvolatile memory array including the trimming redundant memory array according to the embodiment of the present invention.

In FIG. 6, there is shown an internal circuit arrangement of the trimming redundant memory array, according to an embodiment of the present invention.

As the trimming redundant memory array 108, a row of non-volatile memory elements similar to one row of the nonvolatile memory array 107 is employed.

With employment of such a circuit arrangement, the trimming redundant memory array 108 may be readily added.

Also, since the address decoder 104 may be arranged by merely adding one row of the row decoder corresponding to the trimming redundant memory array 108, the circuit may be readily added.

Figure 7:
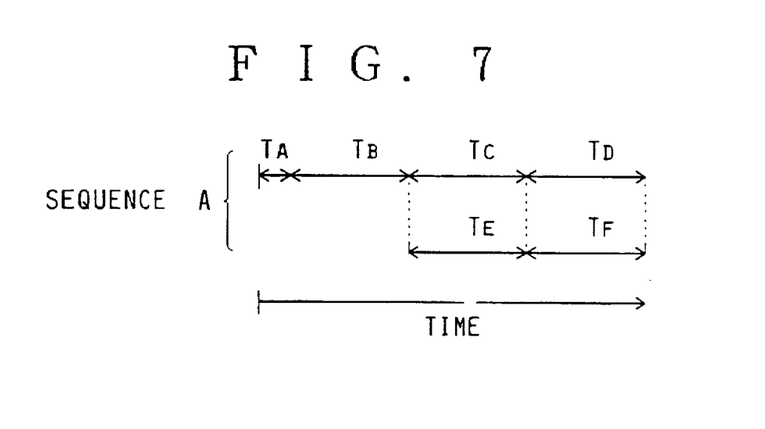
FIG. 7 illustrates a sequence of the data writing operation to the real memory array and the trimming data reading operation from the redundant memory array according to the present invention.

FIG. 7 schematically illustrates the calibration operation according to an embodiment of the present invention, namely a sequence of an input signal during the write operation of the serial interface EEPROM.

A sequence "A" illustrates such a time sequential operation that after the power supply voltage is applied, a time period TA equal to a waiting condition has passed, and then the normal operation can be done.

Subsequent to the waiting condition period $T_A$, an instruction code (will be referred to an "instruction" hereinafter) of the EEPROM is entered in a period $T_B$. Next, an address used to select the relevant memory is inputted in a period $T_C$, and thereafter data to be written into this related memory are sequentially inputted in a period $T_D$.

A time period from a period $T_B$ to a period $T_D$ corresponds to a sequence during which data is written into a memory other than the redundant memory, having the relevant address.

At the same time when the normal operation is performed from the period $T_B$ to the period $T_D$, both of a period $T_E$ and a period $T_F$ are activated in parallel to the period $T_C$ and the period $T_D$, respectively. The period $T_E$ is such a time used to read the trimming data corresponding to the coded trimming information stored in the redundant memory. The period $T_F$ corresponds to such a period during which the read trimming data is sent to the trimming circuit.

A flow of internal signal at this time will be shown with reference to FIG. 1.

When a confirmation is made of such an instruction for writing data into the real memory array in the period $T_B$, an address is inputted into the serial clock control circuit 101 within the period $T_C$.

During this time period, the output signal $S_b$ of the redundant memory control circuit 102 is supplied to the instruction code decode circuit 103 just after the period $T_B$, and a signal for selecting the redundant memory array 108 is produced within the serial clock control circuit.

Then, in output signal $S_c$ of the serial clock control circuit 101 becomes the above-described signal for selecting the redundant memory array 108.

Accordingly, the redundant memory array 108 is selected in the period $T_E$ irrespective of the address entered in the period $T_C$ and the trimming data is read out.

Subsequently, data is inputted into the serial clock control circuit 101, which is written into the nonvolatile memory element within the real memory array in the period $T_D$.

During this time period, an output signal $S_h$ read from the redundant memory array 108 in the period $T_E$ is read by the data reading circuit 109, and thereafter this read signal is entered as an output signal $S_h$ into the trimming circuit 110 in the period $T_F$.

Since an output signal $S_1$ of the output control circuit 113 does not energize the output buffer circuit 114, no trimming data is supplied to the output terminal.

As described above, since both of the period $T_E$ and the period $T_F$ are activated in the parallel manner irrelevant to the period $T_C$ and $T_D$, the data stored in the redundant memory array 108 is read and trimmed in both of the period $T_E$ and $T_F$ in parallel to the normal operation performed in the period $T_B$ until the period $T_D$.

Further, since a series of the above-described operations is executed after the instruction is confirmed in the period $T_B$, the data stored in the redundant memory array 108 can be stably read.

Although this embodiment has been described with respect to the method for trimming the write time during the writing operation of the EEPROM, the present invention is not limited thereto, but may be applied to other circuits during the write operation of the EEPROM, and the read operation.

Moreover, the present invention may be applied to all of such cases that a trimming circuit is employed in a semiconductor integrated circuit device on which an EEPROM is mounted as a portion of constructive elements, and other semiconductor integrated circuit device on which another nonvolatile memory element is mounted.

Figure 8:
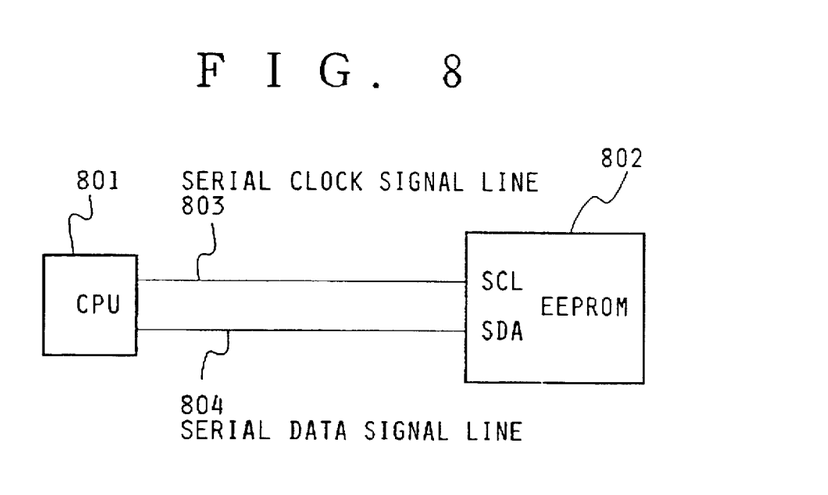
FIG. 8 is a circuit block diagram for showing a system in which the serial interface EEPROM of the present invention is connected with the CPU.

FIG. 8 is a schematic block diagram for showing a system, according to an embodiment, which couples the serial interface EEPROM of the invention and the CPU.

Since in the EEPROM device according to the present invention, the reading operation of the trimming data in the dedicated cycle is omitted by performing the reading operation for reading the trimming data from the redundant memory in parallel to the normal operation, the load of the microprogram of the CPU can be reduced.

Also, since the reading operation for reading the trimming data from the redundant memory is executed after the instruction has been confirmed, the calibration operation can be firmly performed under such a condition that the power supply voltage becomes stable.

It should be understood that although the 2-wire type serial interface has been described in the above-mentioned embodiment of FIG. 8, a similar effect may be achieved even in the 3-wire type serial interface, or the 4-wire type serial interface.

As previously explained, according to the present invention, both of the trimming circuit and the trimming redundant memory array are employed, and then, the arbitrary write time can be set, so that the write time shorter than 1 ms can be ensured.

Furthermore, since the reading operation for reading the trimming data from the redundant memory is executed in parallel with the normal operation, the reading operation of the trimming data in the dedicated cycle can be omitted, and the overall operation can be made simple. As a consequence, the load of the microprogram of the CPU may be reduced.

Also, when the trimming data is read from the redundant memory, the trimming data reading operation is carried out after the instruction is confirmed, so that the trimming data can be stably read out.

What is claimed is:

1. A semiconductor integrated circuit device comprising: a real memory array unit for storing data; storage means for storing trimming data used for adjusting an electrical operating characteristic of the integrated circuit device; readout means for reading out the trimming data from the storage means; trimming means for receiving the trimming data from the readout means and having an operating characteristic which varies in accordance with the trimming data; and time setting means coupled to the trimming means for setting a preselected time period used to drive the device in accordance with the operating characteristic of the trimming means; wherein operation of the semiconductor integrated circuit device is set in accordance with the time period set by the time setting means.

2. A semiconductor integrated circuit device as claimed in claim 1; further comprising control means for receiving an input signal and outputting corresponding trimming data; wherein the operating characteristic of the trimming means is set in accordance with the trimming data output by the control means and the operation of the semiconductor integrated circuit device is set in accordance with the operating characteristic of the trimming means.

3. A semiconductor integrated circuit device as claimed in claim 2; wherein the control means includes means for detecting a predetermined input signal and outputting the trimming data to the trimming means in response thereto.

4. A semiconductor integrated circuit device as claimed in claim 3; wherein the predetermined input signal is a signal having a voltage greater than or equal to 10 volts.

5. A semiconductor integrated circuit device as claimed in claim 1; wherein the storage means comprises a nonvolatile memory element.

6. A semiconductor integrated circuit device as claimed in claim 5; wherein the nonvolatile memory element is an electrically erasable nonvolatile memory element.

7. A semiconductor integrated circuit device as claimed in claim 1; wherein the trimming means comprises a plurality of constant current transistors and a plurality of switching transistors; and wherein the constant current transistors are connected in series with the switching transistors, at least one terminal of the constant current transistors is commonly connected to the plurality of constant current transistors and to the time setting means, and the switching transistors are receptive of the trimming data so that the trimming means causes a desired current to flow through the constant current transistors in accordance with the trimming data.

8. A semiconductor integrated circuit device as claimed in claim 1; wherein the time setting means comprises a capacitance element, a constant voltage circuit, a constant current circuit connected to the constant voltage circuit, and a voltage comparing circuit connected to the constant current circuit; wherein the constant current circuit has an output terminal connected to the capacitance element, and the voltage comparing circuit has a terminal to which a reference voltage is input and another terminal to which the output terminal of the constant current circuit is connected.

9. A semiconductor integrated circuit device as claimed in claim 8; wherein the trimming means is connected to the constant voltage circuit.

10. A semiconductor integrated circuit device as claimed in claim 1; wherein the time setting means comprises a constant current circuit and a voltage comparing circuit, and the constant current circuit includes a current mirror circuit.

11. A semiconductor integrated circuit device as claimed in claim 10; wherein the current mirror circuit includes at least two constant current transistors, gates of two of the constant current transistors are electrically connected to each other, and an output terminal of one of the constant current transistors is connected to the trimming means and the voltage comparing circuit.

12. A semiconductor integrated circuit device as claimed in claim 1; wherein the trimming means comprises a plurality of capacitors and a plurality of switching transistors; and wherein the plural capacitors are connected in series with the switching transistors, at least one terminal of each of the capacitors is commonly connected to each other and to the time setting means, and the switching transistors are receptive of the trimming data so that the trimming means is set to a desired capacitance value in accordance with the trimming data.

13. A semiconductor integrated circuit device as claimed in claim 12; wherein the time setting means includes a constant current circuit and a voltage comparing circuit, and the constant current circuit includes a current mirror circuit.

14. A semiconductor integrated circuit device as claimed in claim 13; wherein the current mirror circuit includes at least two constant current transistors, gates of at least two of the constant current transistors are electrically connected to each other, and an output terminal of one of the constant current transistors is connected to the trimming means and the voltage comparing circuit.

15. A semiconductor integrated circuit device as claimed in claim 1; wherein the trimming means comprises a current mirror circuit having a plurality of constant current transistors arranged in parallel, and a plurality of switching transistors; and wherein each of the plural switching transistors is connected to a source of each of the constant current transistors, gates of the plurality of constant current transistors are commonly connected to each other, drains of the plurality of constant current transistors are commonly connected to each other, and the switching transistors are receptive of the trimming data so that the trimming means causes a desired current to flow through the constant current transistors in accordance with the trimming data.

16. A semiconductor integrated circuit device as claimed in claim 15; wherein the time setting means comprises a capacitance element and a voltage comparing circuit; and wherein the drains of the plurality of constant current transistors are connected to the capacitance element and the voltage comparing circuit.

17. A method for driving a semiconductor integrated circuit device comprising trimming means for receiving trimming data used for adjusting an electrical operating characteristic of the semiconductor integrated circuit device, the trimming means having operating characteristics which are set in accordance with the trimming data; and control means for outputting the trimming data to the trimming means, wherein operation of the semiconductor integrated circuit device is set in accordance with the operating characteristics of the trimming means, comprising the steps of:
  inputting a predetermined signal to the control means;
  writing the trimming data into the trimming means after the predetermined signal has been input, thereby setting initial operating characteristics of the trimming means; and
  setting initial operating characteristics of the semiconductor integrated circuit device in accordance with the initial operating characteristics of the trimming means.

18. A method for driving a semiconductor integrated circuit device as claimed in claim 17; wherein the semiconductor integrated circuit device further comprises storage means for storing the trimming data and reading means for reading the trimming data from the storage means; and the method for driving further comprises the step of writing the trimming data into the storage means after the predetermined signal has been input.

19. A method for driving a semiconductor integrated circuit device as claimed in claim 18; wherein the semiconductor integrated circuit device further comprises time setting means connected to the trimming means, and a nonvolatile memory element connected to the time setting means; wherein the read/write timing of the nonvolatile memory element is set by the time setting means; and wherein the method for driving further comprises the steps of writing to and reading from the nonvolatile memory element and wherein at least both of reading from or writing to the nonvolatile memory element and reading the trimming data from the storage means using the reading means are conducted in a parallel manner.

20. A method for driving a semiconductor integrated circuit device comprising storage means for storing trimming data, reading means connected to the storage means for reading out the trimming data, trimming means connected to the reading means, and time setting means connected to the trimming means, comprising the steps of:
  reading the trimming data stored in the storage means;
  varying an operating characteristic of the trimming means in accordance with the trimming data; and
  setting a desired time period used for driving the device using the time setting means in accordance with the operating characteristics of the trimming means;
  wherein a current flowing through the trimming means is set in accordance with the trimming data, and the time period set by the time setting means is set in accordance with the current flowing through the trimming means.

21. A method for driving a semiconductor integrated circuit device as claimed in claim 20; further comprising the steps of setting initial operating characteristic data in the storage means, and writing the trimming data into the storage means.

22. A method for driving a semiconductor integrated circuit device as claimed in claim 20; wherein the trimming means sets a capacitance thereof in response to the trimming data, and the time period set by the time setting means is set in accordance with the capacitance of the trimming means.

23. A method for driving a semiconductor integrated circuit device as claimed in claim 20; wherein the time setting means comprises a constant current transistor, a capacitance element connected to an output terminal of the constant current transistor, and a voltage comparing circuit connected to the output terminal; and the method for driving further comprises the steps of charging the capacitance element via the constant current transistor, and sending an output signal by the voltage comparing circuit when a voltage of the output terminal reaches a predetermined level.

24. An integrated circuit device comprising: storage means for storing trimming data used for adjusting an electrical operating characteristic of the integrated circuit device; readout means for reading out the trimming data from the storage means; trimming means for receiving the trimming data from the readout means and controlling the integrated circuit device in accordance therewith; and timer means for setting a predetermined time period for use in driving the device in accordance with an operating characteristic of the trimming means set using the trimming data.

25. An integrated circuit device according to claim 24; further comprising control means for receiving a predetermined input signal and controlling the readout means to output the trimming data to the trimming means in response thereto.

26. An integrated circuit device according to claim 25; wherein the predetermined input signal is a signal having a voltage level above a predetermined level.

27. An integrated circuit device according to claim 24; wherein the timer means comprises a constant voltage circuit for receiving an output of the trimming means, a constant current circuit connected to the constant voltage circuit, a capacitive element connected to the constant current circuit, and a comparator circuit connected to the constant current circuit for comparing a reference potential to a potential level of the capacitive element such that the comparator circuit produces an output signal when the potential level of the capacitive element reaches the reference potential.

28. An integrated circuit device according to claim 24; wherein the timer means comprises a current mirror circuit for receiving an output of the trimming means.

29. An integrated circuit device according to claim 28; wherein the current mirror circuit comprises at least two constant current transistors having gates which are interconnected, and wherein an output terminal of one constant current transistor is connected to the trimming means.

30. An integrated circuit device according to claim 24; wherein the storage means comprises a non-volatile memory device.

31. An integrated circuit device according to claim 24; further comprising a memory array having a real memory portion and a redundant memory portion; wherein the storage means comprises the redundant memory portion.

32. An integrated circuit device according to claim 24; wherein the trimming means comprises a constant current circuit for supplying a predetermined constant current to the timer means and a switching circuit connected to the constant current circuit and receptive of the trimming data for outputting a predetermined current to the constant current circuit in accordance with the trimming data to enable the predetermined time period to be set in accordance with the predetermined constant current.

33. An integrated circuit device according to claim 24; wherein the trimming means includes a current mirror circuit having a plurality of parallel-connected constant current transistors having commonly connected gates and drains, and a plurality of switching transistors, each of the switching transistors being connected to a source of a respective constant current transistor, the switching transistors being receptive of the trimming data such that the trimming means causes a desired current to flow in accordance with the trimming data.

34. A method for driving an integrated circuit device comprising a nonvolatile memory array having a real memory portion and a redundant memory portion, a row decoder and a column decoder for driving the memory array, trimming means for receiving trimming data to set an electrical operating characteristic thereof, timer means connected to the trimming means, and control means for outputting the trimming data stored in the redundant memory portion to the trimming means, wherein operation of the integrated circuit device is set in accordance with the operating characteristic of the trimming means, the driving method comprising the steps of:

supplying the trimming data to the trimming means in response to the detection of a predetermined input signal supplied to the control means; and setting operating characteristics of the integrated circuit device in accordance with the operating characteristic of the trimming means;

wherein a time period during which data is read from or written to the real memory portion of the nonvolatile memory array overlaps with a time period during which the trimming data is supplied to the trimming means.

35. A method for driving an integrated circuit device according to claim 34; wherein the steps of supplying the trimming data to the trimming means and setting the operating characteristics of the device are conducted in the following sequence: a first period $T_A$ during which the integrated circuit device is in a wait state; a second period $T_B$ during which an instruction code is acquired; a third period $T_C$ during which an address for specifying the real memory portion of the nonvolatile memory array is acquired; a fourth period $T_D$ during which one of data to be written to the nonvolatile memory array is acquired or data is read from the nonvolatile memory array; and a fifth period $T_E$ during which the row decoder and the column decoder select the redundant memory portion and the trimming data stored in the redundant memory portion is read out; wherein the fifth period $T_E$ overlaps the third period $T_C$.

36. A method for driving an integrated circuit device according to claim 35; further comprising a data writing sequence for writing data to the real memory portion of the nonvolatile memory array; wherein the data writing sequence is conducted in a sixth period $T_F$ during which the trimming data is supplied to the trimming means and the sixth period $T_F$ overlaps with the fourth period $T_D$, and a data write time period is conducted after at least one of the fourth and sixth periods $T_D$ and $T_F$, the length of which is determined by the trimming data.

37. A memory device having means for controlling an operating characteristic thereof, comprising: storage means for storing trimming data used for setting a timing characteristic of the memory device; readout means for reading out the trimming data from the storage means; trimming means for receiving the trimming data from the readout means and controlling a timing operation of the memory device in accordance therewith; and timing means coupled with the trimming means for setting a predetermined time period of a write signal of the memory device in accordance with the operating characteristic of the trimming means set using the trimming data.

38. A memory device according to claim 37; further comprising control means for receiving a predetermined input signal and controlling the readout means to output the trimming data to the trimming means in response thereto.

39. A memory device according to claim 38; wherein the predetermined input signal is a signal having a voltage level above a predetermined level.

40. A memory device according to claim 37; wherein the timing means comprises a constant voltage circuit for receiving an output of the trimming means, a constant current circuit connected to the constant voltage circuit, a capacitive element connected to the constant current circuit, and a comparator circuit connected to the constant current circuit for comparing a reference potential to a potential level of the capacitive element such that the comparator circuit produces an output signal when the potential level of the capacitive element reaches the reference potential.

41. A memory device according to claim 37; wherein the timing means comprises a current mirror circuit for receiving an output of the trimming means.

42. A memory device according to claim 41; wherein the current mirror circuit comprises at least two constant current transistors having gates which are interconnected, and wherein an output terminal of one constant current transistor is connected to the trimming means.

43. A memory device according to claim 37; wherein the storage means comprises a non-volatile memory device.

44. A memory device according to claim 37; further comprising a memory array having a real memory portion and a redundant memory portion; wherein the storage means comprises the redundant memory portion.

45. A memory device according to claim 37; wherein the trimming means comprises a constant current circuit for supplying a predetermined constant current to the timing means, and a switching circuit connected to the constant current circuit and receptive of the trimming data for outputting a predetermined current to the constant current circuit in accordance with the trimming data to enable the predetermined time period to be set in accordance with the predetermined constant current.

46. A memory device according to claim 37; wherein the trimming means includes a current mirror circuit having a plurality of parallel-connected constant current transistors having commonly connected gates and drains, and a plurality of switching transistors, each of the switching transistors being connected to a source of a respective constant current transistor, the switching transistors being receptive of the trimming data such that the trimming means causes a desired current to flow in accordance with the trimming data.

47. A method for driving a memory device comprising a nonvolatile memory array having a real memory portion and a redundant memory portion, a row decoder and a column decoder for driving the memory array, trimming means for receiving trimming data to set a time period of a write signal for writing to the memory device, timer means connected to the trimming means, and control means for outputting the trimming data stored in the redundant memory portion to the trimming means, wherein the time period of the write signal of the memory device is set in accordance with operating characteristics of the trimming means, the driving method comprising the steps of:

supplying the trimming data to the trimming means in response to the detection of a predetermined input signal supplied to the control means; and setting the time period of the write signal for writing to the memory device in accordance with the operating characteristics of the trimming means;

wherein a time period during which data is read from or written to the real memory portion of the nonvolatile memory array overlaps with a time period during which the trimming data is supplied to the trimming means.

48. A method for driving a memory device according to claim 47; wherein the steps of supplying the trimming data to the trimming means and setting the time period of the write signal for writing to the memory device are conducted in the following sequence: a first period $T_A$ during which the memory device is in a wait state; a second period $T_B$ during which an instruction code is acquired; a third period $T_C$ during which an address for specifying the real memory portion of the nonvolatile memory array is acquired; a fourth period $T_D$ during which one of data to be written to the nonvolatile memory array is acquired or data is read from the nonvolatile memory array; and a fifth period $T_E$ during which the row decoder and the column decoder select the redundant memory portion and the trimming data stored in the redundant memory portion is read out; wherein the fifth period $T_E$ overlaps the third period $T_C$.

49. A method for driving a memory device according to claim 48; further comprising a data writing sequence for writing data to the real memory portion of the nonvolatile memory array; wherein the data writing sequence is conducted in a sixth period $T_F$ during which the trimming data is supplied to the trimming means and the sixth period $T_F$ overlaps with the fourth period $T_D$, and a data write time period is conducted after at least one of the fourth and sixth periods $T_D$ and $T_F$, the length of which is determined by the trimming data.

* * * * *